United States Patent
Kimura et al.

(10) Patent No.: US 7,550,837 B2
(45) Date of Patent: *Jun. 23, 2009

(54) SEMICONDUCTOR DEVICE AND VOLTAGE REGULATOR

(75) Inventors: Keiichi Kimura, Kanagawa (JP); Masami Takai, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 400 days.

This patent is subject to a terminal disclaimer.

(21) Appl. No.: 11/331,162

(22) Filed: Jan. 13, 2006

(65) Prior Publication Data

US 2006/0113632 A1 Jun. 1, 2006

Related U.S. Application Data

(62) Division of application No. 10/486,885, filed on Feb. 17, 2004, now Pat. No. 7,061,093.

(51) Int. Cl.
*H01L 29/00* (2006.01)
*H01L 23/48* (2006.01)
*H01L 23/52* (2006.01)
*H01L 29/40* (2006.01)

(52) U.S. Cl. .................. 257/690; 257/532; 257/737

(58) Field of Classification Search ......... 257/690–697, 257/737–738, 734, 777–780, 532, E23.02, 257/E23.019

See application file for complete search history.

(56) References Cited

U.S. PATENT DOCUMENTS

| 5,633,785 | A | 5/1997 | Parker et al. |
| 6,025,647 | A | 2/2000 | Shenoy et al. |
| 6,091,318 | A | 7/2000 | Lee et al. |
| 6,259,238 | B1 | 7/2001 | Hastings |
| 6,365,498 | B1 | 4/2002 | Chu et al. |
| 6,472,749 | B1 | 10/2002 | Hirano |
| 6,486,005 | B1 | 11/2002 | Kim |
| 6,525,412 | B2 | 2/2003 | Noshita |
| 6,664,176 | B2 | 12/2003 | Hedler et al. |
| 6,870,252 | B2 * | 3/2005 | Novak et al. ............ 257/691 |
| 2002/0096757 | A1 | 7/2002 | Takao et al. |

FOREIGN PATENT DOCUMENTS

| EP | 1 020 915 A2 | 7/2000 |
| JP | 63-310139 | 12/1988 |
| JP | 2000-183214 | 6/2000 |
| JP | 2000-353752 | 12/2000 |
| JP | 2000-353762 | 12/2000 |
| JP | 2002-314028 | 10/2002 |

* cited by examiner

*Primary Examiner*—Cuong Q Nguyen
(74) *Attorney, Agent, or Firm*—Dickstein Shapiro LLP (57) ABSTRACT

A semiconductor device having a chip size package is disclosed. The chip size package comprises a semiconductor chip having at least a bonding pad, at least a terminal of said chip size package and a reroute trace formed between the bonding pad and the terminal on said chip size package. The reroute trace is formed to have a desired resistance.

6 Claims, 12 Drawing Sheets

| | 5mΩ | 10mΩ | 50mΩ | 100mΩ | 500mΩ | 1Ω | 5Ω | 10Ω | 20Ω |
|---|---|---|---|---|---|---|---|---|---|
| STABILITY OF CIRCUIT | × | ○ | ○ | ○ | ○ | ○ | ○ | ○ | ○ |

| | 5mΩ | 10mΩ | 30mΩ | 50mΩ | 70mΩ | 100mΩ | 150mΩ | 200mΩ | 250mΩ |
|---|---|---|---|---|---|---|---|---|---|
| STABILITY OF CIRCUIT | × | ○ | ○ | S | S | S | S | S | S |
| OTHER CHARACTERISTICS | S | S | S | S | S | ○ | ○ | ○ | × |

SEMICONDUCTOR DEVICE AND VOLTAGE REGULATOR

CROSS REFERENCE TO RELATED APPLICATIONS

This application is a Divisional Application of application Ser. No. 10/486,885, filed Feb. 17, 2004 now U.S. Pat. No. 7,061,093 the entire disclosure of which is hereby incorporated by reference.

TECHNICAL FIELD

The present invention relates to a semiconductor device using a chip size package (CSP), and more particularly to a semiconductor device in which reroute traces are used for providing circuit design with flexibility. The present invention is suitable for a phase compensation circuit for a voltage regulator placed on the CSP or other analog circuits placed on the CSP.

BACKGROUND ART

Various kinds of packages for LSI chips are known. Recently, a chip size package (CSP) having almost the same size as the LSI chip, has been put under development in order to reduce the size of the package.

Figure 1:
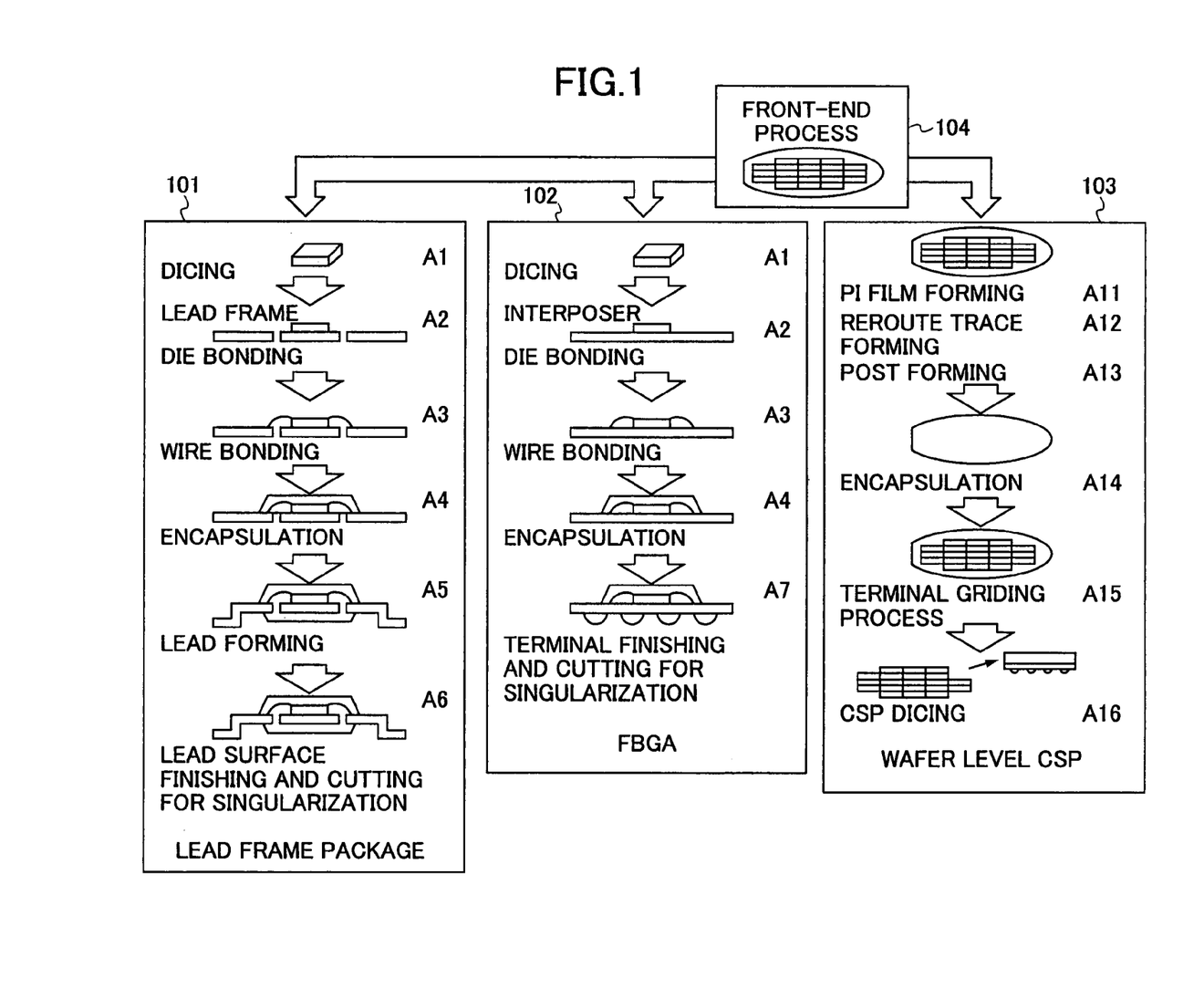
FIG. 1 shows conventional manufacturing processes for various kinds of chip size packages.

FIG. 1 shows packaging processes for various kinds of conventional chip size packages. Reference numeral 101 shown in FIG. 1 shows a packaging process for a lead frame package, reference numeral 102 shown in FIG. 1 shows a packaging process for a Fine-pitch Ball Grid Array (FBGA) and reference numeral 103 shown in FIG. 1 shows a packaging process for a wafer-level CSP.

The packaging process 101 for the Lead frame package and the packaging process 102 for the FBGA shown in FIG. 1 are conventional packaging processes (a dicing process A1, a die bonding process A2, a wire bonding process A3, an encapsulation process A4, a lead forming process A5/a lead surface finishing process and a cutting process for singularization (dicing a wafer into single chips) A6 or a terminal finishing process and a cutting process for singularization A7). In these packaging processes, each chip processed by a front-end process 104 is cut by the dicing process and the chip is assembled by an assembly process. However, in a packaging process 103 in the wafer level CSP of the present invention as shown in FIG. 1, a wafer processed by the front-end process is directly processed by the packaging process 103 (a Pi film forming process A11, a reroute tracing process A12, a post forming process A13, an encapsulation process A14, and a terminal grinding process A15). Then, the wafer is cut to singularize each chip (a dicing process A16).

Figure 2:
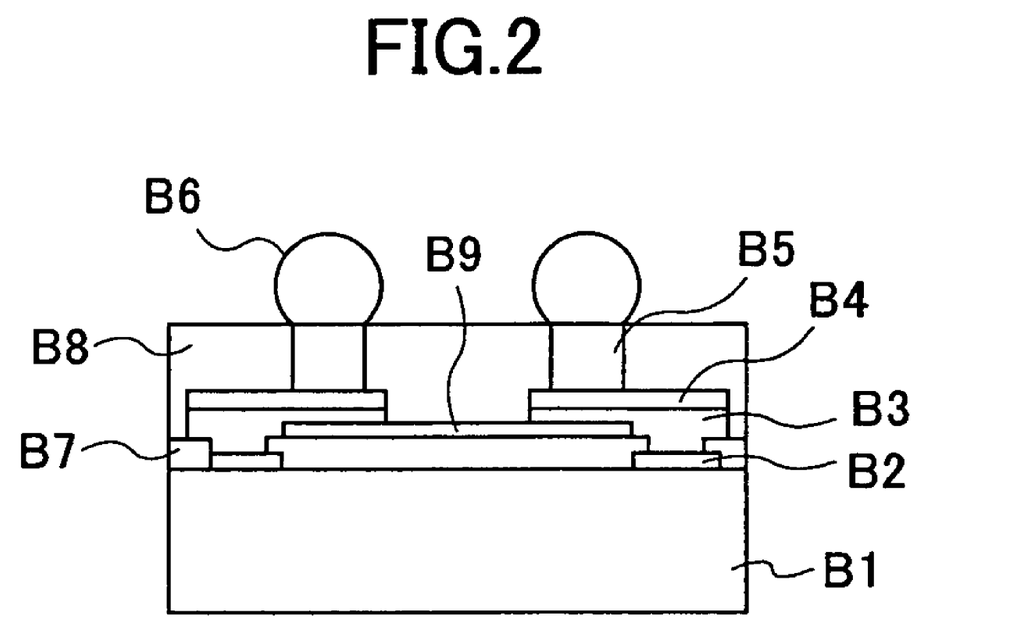
FIG. 2 shows a sectional view of a manufactured chip using a wafer level chip size packaging technology.

FIG. 2 shows a sectional view of the chip manufactured by the wafer level CSP technology. In FIG. 2, reference numeral B1 shows an IC chip (a silicon chip), reference numeral B2 shows an aluminum electrode placed on a pad of the IC chip B1, reference numeral B3 shows a barrier metal layer, reference numeral B4 shows a reroute trace layer (Cu) placed on the barrier metal layer B3, reference numeral B5 shows a copper post, reference numeral B6 shows a solder bump (a solder ball), reference numeral B7 shows a passivation layer, reference numeral B8 shows a mold layer(for example, a resin encapsulation layer) and reference numeral B9 shows a protection film.

In the conventional wafer level CSP, it is assumed that the aluminum electrode B2 placed on the pad of the IC chip B1 is connected to the copper post B5 and the solder bump (the solder ball) B6 only through the reroute trace B4 having a resistance as low as possible.

However, there is a problem that specifications and performance of the CSP are limited by the structure of the IC chip, if it is assumed that the aluminum electrode placed on the pad of the IC chip B1 is connected to the copper post B5 and the solder bump (the solder ball) B6 only through the reroute trace B4 having a resistance as low as possible.

DISCLOSURE OF THE INVENTION

Accordingly, it is a general object of the present invention to provide a semiconductor device and a voltage regulator in which the above-described disadvantage is eliminated.

A more specific object of the present invention is to provide a semiconductor device in which specifications and performance of an IC chip itself can be expanded, and which semiconductor device provides circuit design with flexibility.

Another object of the present invention is to provide a semiconductor device including a voltage regulator in which oscillation of the voltage regulator can easily be suppressed.

The above objects of the present invention are achieved by a semiconductor device having a chip size package, the chip size package comprising:

a semiconductor chip having at least a bonding pad;

at least a terminal of said chip size package; and a reroute trace formed between said bonding pad and said terminal on said chip size package, wherein the reroute trace is formed to have a desired resistance.

The above objects of the present invention are achieved by the semiconductor device, wherein the chip size package has a plurality of terminals, each of which is connected to the bonding pad through one of a plurality of reroute traces.

The above objects of the present invention are achieved by the semiconductor device, wherein the desired resistance of the reroute trace is designed by means of lengthening the reroute trace, narrowing the reroute trace or selecting material of the reroute trace.

According to the present invention, it is possible to provide the semiconductor device in which the specifications and the performance of the IC chip can be expanded, and which semiconductor device provides circuit design with flexibility.

The above objects of the present invention are achieved by the semiconductor device, wherein the semiconductor chip comprises a voltage regulator circuit, and a load is connected to one terminal connected to one reroute trace having the lowest resistance among the reroute traces, and a phase compensation capacitor is connected to another terminal having another reroute trace having a predetermined resistance among the reroute traces.

The above objects of the present invention are achieved by the semiconductor device, wherein said predetermined resistance is between 10 milli-ohms and 10 ohms.

The above objects of the present invention are achieved by the semiconductor device, wherein the semiconductor chip comprises a voltage regulator circuit, and a load and a phase compensation capacitor are connected to the terminal of the chip size package connected to said reroute trace having the desired resistance.

The above objects of the present invention are achieved by the semiconductor device, wherein the desired resistance of the reroute trace is designed by means of lengthening the reroute trace, narrowing the reroute trace or selecting material of the reroute trace.

The above objects of the present invention are achieved by the semiconductor device, wherein the desired resistance is between 10 milli-ohms and 200 milli-ohms.

According to the present invention, it is possible to provide a semiconductor device including a voltage regulator in which oscillation can easily be suppressed.

As described above, according to the present invention, it is possible to determine the circuit characteristics of the voltage regulator during the CSP manufacturing process so as to use the phase compensation capacitor. Therefore, the present invention enables providing the circuit design at the wafer level with flexibility. Further, it is easy to improve the circuit characteristics without changing the circuit design at the wafer level. Further, it is possible to provide the voltage regulator in which a ceramic capacitor is used as a phase compensation capacitor to prevent the voltage regulator from oscillating.

BRIEF DESCRIPTION OF THE DRAWINGS

Other objects, features and advantages of the present invention will become more apparent from the following detailed description when read in conjunction with the accompanying drawings, in which.

BEST MODE FOR CARRYING OUT THE INVENTION

A description will now be given, with reference to the accompanying drawings, of embodiments of the present invention.

FIRST EMBODIMENT

FIGS. 3A through 3D show the first embodiment of the present invention in which a bonding pad of an IC chip is connected to a plurality of solder bumps that are output terminals of a chip size package (CSP), through a plurality of reroute traces.

Figure 3A:
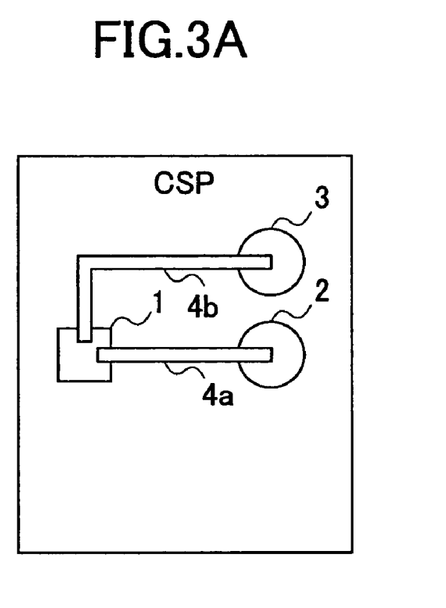
FIG. 3A shows a diagram of the first embodiment of the present invention.
Figure 3B:
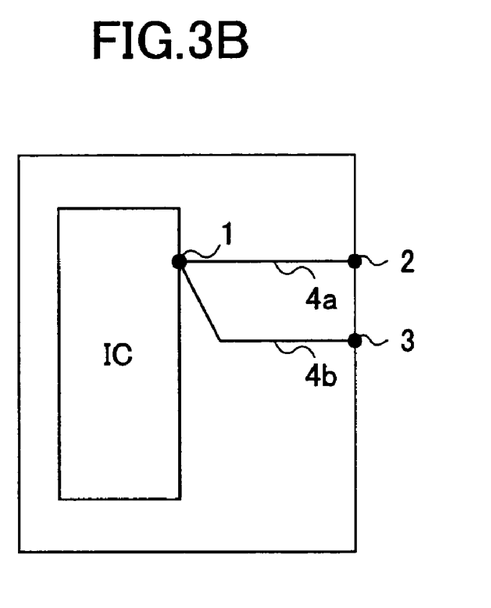
FIG. 3B shows a diagram of the first embodiment of the present invention.
Figure 3C:
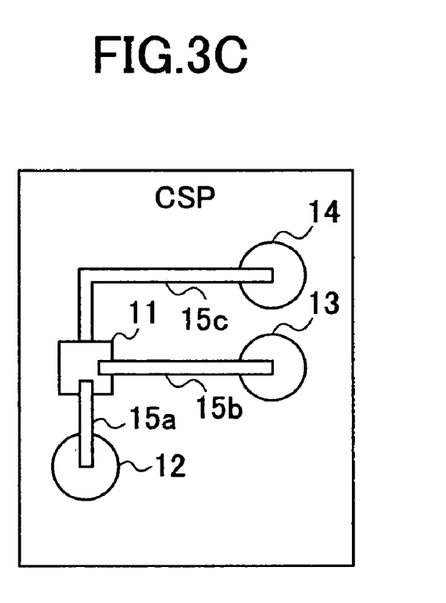
FIG. 3C shows a diagram of the first embodiment of the present invention.
Figure 3D:
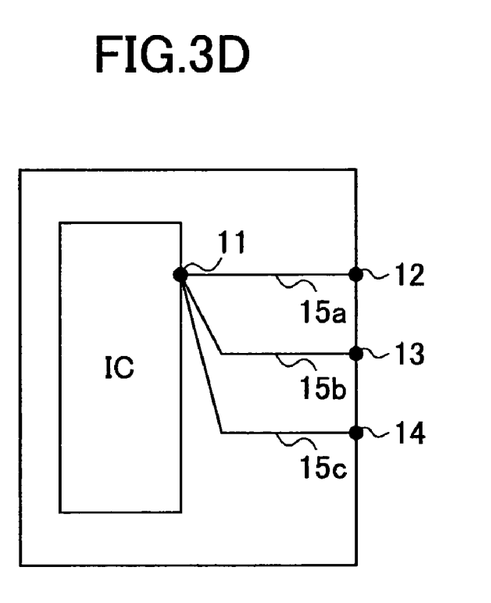
FIG. 3D shows a diagram of the first embodiment of the present invention.

FIG. 3A shows a configuration in which a bonding pad 1 of the IC chip is connected to two solder bumps 2 and 3 through two reroute traces 4a and 4b. FIG. 3B shows an equivalent circuit of the configuration shown in FIG. 3A. FIG. 3C shows a configuration in which a bonding pad 11 of the IC chip is connected to three solder bumps 12, 13 and 14 through three reroute traces 15a, 15b and 15c. FIG. 3D shows an equivalent circuit of the configuration shown in FIG. 3C. It is understood that a bonding pad of the IC chip can be connected to more than three solder bumps through the reroute traces.

This configuration enables connecting each bonding pad to a plurality of solder bumps placed on desired positions on the chip size package through the reroute traces. Therefore, it is possible to output a signal supplied from the bonding pad of the IC chip through the solder bumps placed on desired positions on the chip size package. As a result, the application area of the chip size package can be largely expanded.

SECOND EMBODIMENT

Next, a second embodiment of the present invention will be explained.

In the first embodiment of the present invention, the resistance of a reroute trace is not taken into account (or it is assumed that the reroute trace has a resistance of nearly zero). In the second embodiment of the present invention, the resistance of a reroute trace that connects a bonding pad with one of plurality of solder bumps is designed to have a predetermined value.

Figure 4A:
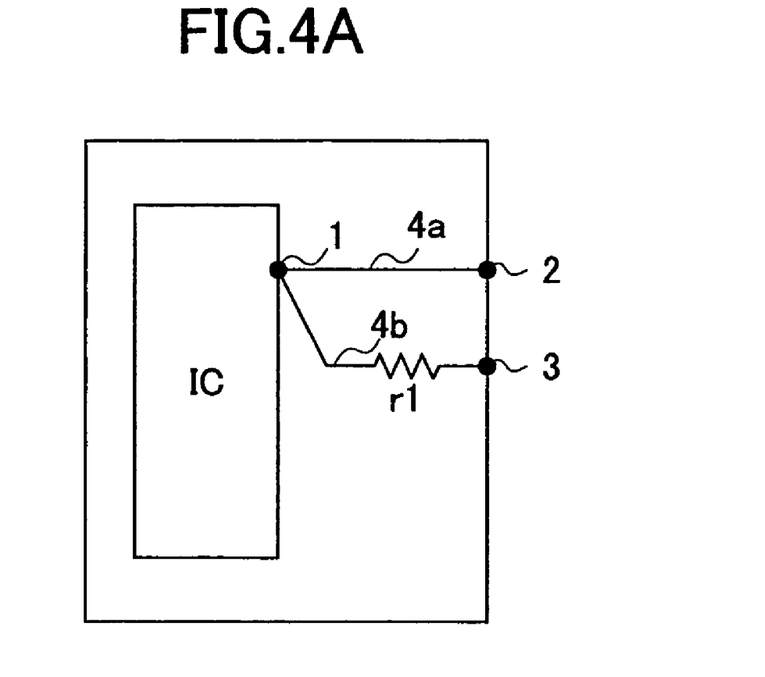
FIG. 4A shows a diagram of the second embodiment of the present invention.
Figure 4B:
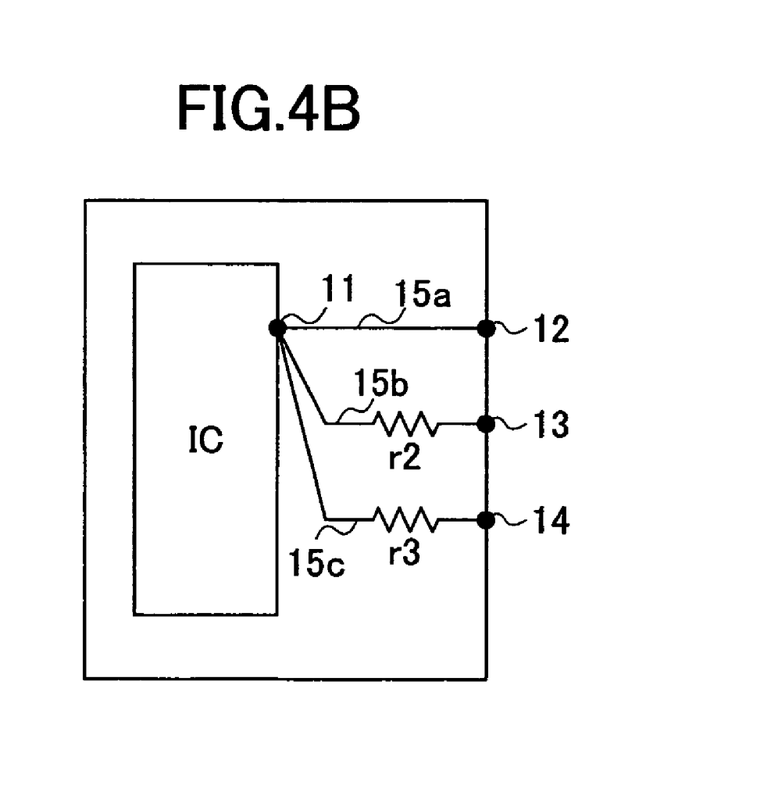
FIG. 4B shows a diagram of the second embodiment of the present invention.

FIGS. 4A and 4B show the second embodiment of the present invention. FIG. 4A shows an equivalent circuit of the configuration shown in FIG. 3A in which the resistance of the reroute trace 4a is designed to be nearly zero and the resistance of the reroute trace 4b is designed to be a value of r1. FIG. 4B shows an equivalent circuit of the configuration shown in FIG. 3C in which the resistance of the reroute trace 15a is designed to be nearly zero, the resistance of the reroute trace 15b is designed to be a value of r2, and the resistance of the reroute trace 15c is designed to be a value of r3. Selection of the resistance of each reroute trace is design a matter and the value of each resistance depends on the circuit to which the present invention is applied. Employing this configuration, the application area of the chip size package can be further expanded compared to the first embodiment of the present invention mentioned above.

THIRD EMBODIMENT

Figure 5:
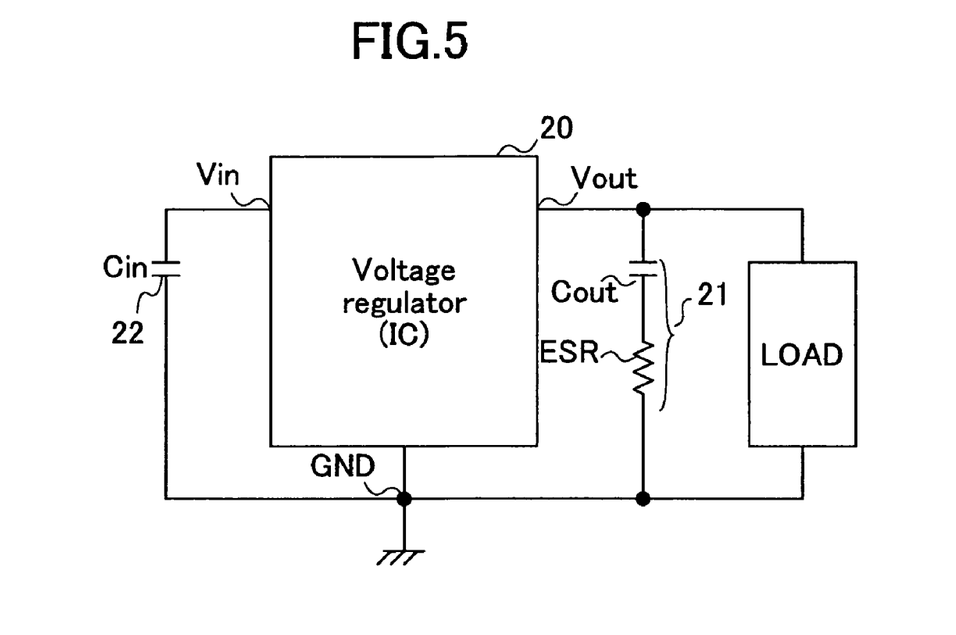
FIG. 5 shows an example of a generic voltage regulator which is operating.

Next, the third embodiment of the present invention will be explained. In the third embodiment, the present invention is applied to a voltage regulator. However, it is understood that the present invention can be applied to any analog circuit and various kinds of semiconductor devices. FIG. 5 show an example of a circuit diagram of a voltage regulator which is operating. In FIG. 5, a capacitor 21 having a capacitance of Cout is connected between an output terminal Vout of the voltage regulator 20 and a ground GND, and a capacitor 22 having a capacitance Cin is connected between an input terminal Vin of the voltage regulator 20 and the ground GND in order to stabilize an input voltage and an output voltage. A resistance ESR (Equivalent Series Resistance) shows the internal resistance of the capacitor 21.

Figure 6:
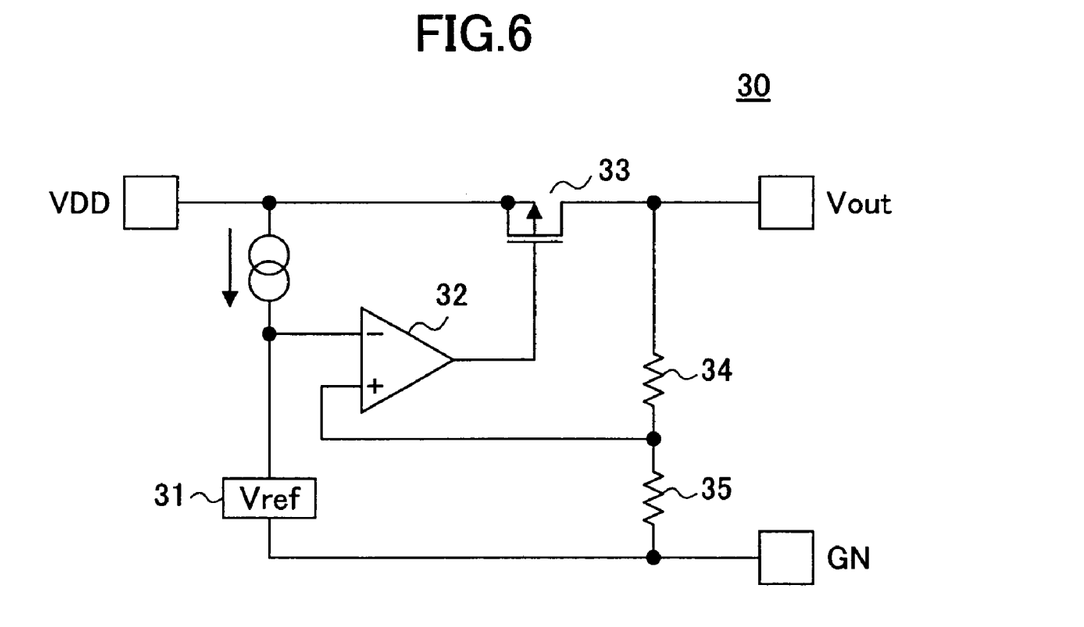
FIG. 6 shows an internal structure of the generic voltage regulator shown in FIG. 5.

FIG. 6 shows an internal structure of the example of the generic voltage regulator. As shown in FIG. 6, the generic voltage regulator 30 has a constant voltage source 31, a differential amplifier 32, an output transistor 33 and resistors 34 and 35. The generic voltage regulator 30 may oscillate because the resistors 34 and 35 construct a feed back circuit. VDD shows an input terminal of power, Vout shows an output terminal of the voltage regulator and GN shows ground.

Figures 7A, 7B:
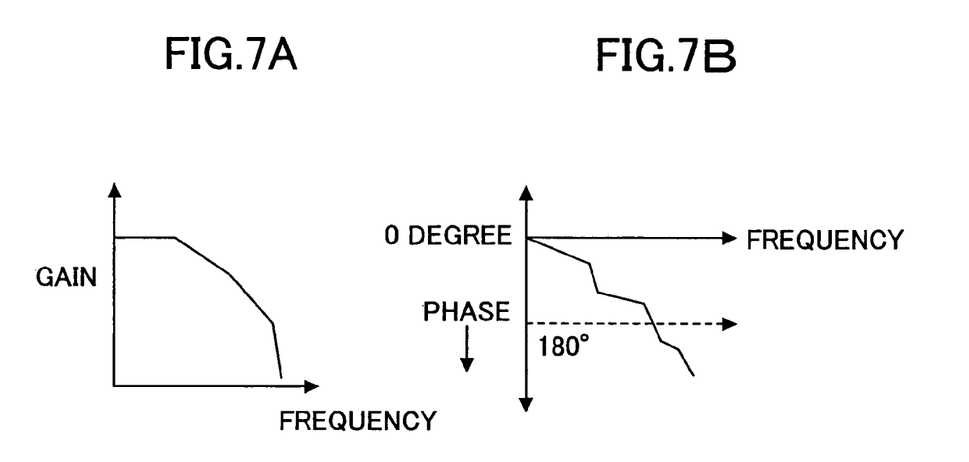
FIG. 7A shows a graph of frequency response versus gain of an open loop of the voltage regulator that oscillates.
FIG. 7B shows a graph of frequency response versus phase of the open loop of the voltage regulator that oscillates.

FIG. 7A shows frequency response versus gain of an open loop of the generic voltage regulator 30 and FIG. 7B shows frequency response versus phase of the open loop of the generic voltage regulator 30.

The generic voltage regulator 30 usually has two or three poles in the differential amplifier 32 (having two stages) and the output transistor 33. When one pole exists, the open loop gain of the generic voltage regulator 30 is reduced 6 dB/octave and the phase of the open loop is delayed 90 degrees. Therefore, the frequency response of the open loop has the gain characteristics shown in FIG. 7A and the phase delay characteristics shown in FIG. 7B. Because there is a frequency at which the phase delay is 180 degrees, the generic voltage regulator 30 may oscillate when the control loop is closed to construct a feed back loop. Therefore, compensating is needed the phase in order to prevent the generic voltage regulator 30 from oscillating.

Figures 8A, 8B:
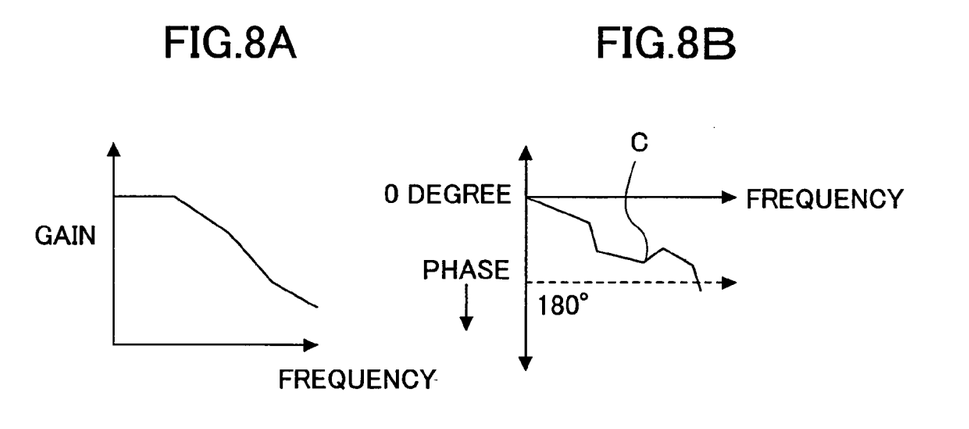
FIG. 8A shows a graph of frequency response versus gain of the voltage regulator that does not oscillate.
FIG. 8B shows a graph of frequency response versus phase of the voltage regulator that does not oscillate.

The phase compensation is performed inside of the voltage regulator 20. However, the phase compensation uses zero, which is an inverse of a pole, which is formed by both the capacitance Cout and the resistance ESR of the capacitor 21 connected to the output terminal Vout. In FIG. 8B, the zero is placed at a frequency of $1/(2*\pi*Cout*ESR)$ [Hz]. Therefore, it is possible to advance the phase of the open loop in order not to delay the phase at a frequency point C more than 180 degree. As a result, it is possible to prevent the voltage regulator 20 from oscillating.

There are several kinds of capacitors 21, such as a tantalum capacitor and a ceramic capacitor, used for the voltage regulator 20. The ESR of the tantalum capacitor is several ohms and the ESR of ceramic capacitor is several tens of milliohms.

When the tantalum capacitor having a capacitance of several micro Farads, which is commonly used, is used for the phase compensation, the zero emerges at a frequency at which the open loop gain is about 0 dB. The phase margin is reduced to around zero degrees at the frequency at which the open loop gain is about 0 dB because the phase is delayed along with the increase of the frequency. Therefore, the phase is easily compensated for by the tantalum capacitor having a capacitance of several micro Farad.

However, for the ceramic capacitor, the zero emerges at a higher frequency than that of the tantalum capacitor, because the ESR of the ceramic capacitor having the same capacitance as the tantalum capacitor is less than the ESR of the tantalum capacitor. As a result, the phase compensation value is decreased and the phase cannot be compensated for sufficiently. Therefore, it is required to add a resistance to the ESR of the ceramic capacitor by some means. If the ESR is increased by serially connecting a resistor to the ESR, the phase can be compensated for easily.

This requirement is achieved by placing the voltage regulator on the CSP of the present invention. It is then possible to serially connect a resistor, constructed by means of the reroute trace, to the ESR, by using the CSP of the present invention. As a result, the phase compensation for the voltage regulator can be easily performed.

Next, the third embodiment of the present invention in which a voltage regulator is placed on the CSP will be explained. As shown in FIG. 2, in the CSP, a protection film B9 is deposited on the passivation layer B7 of the IC chip B1 and the reroute trace B4 is deposited on the aluminum electrode B2 and connected to the copper post B5. Then, the resin encapsulation layer B8 is deposited and finally, the solder bump (the solder ball) B6 is placed on the copper post B5.

As described above, serially connecting a resistor to the ESR to facilitate the phase compensation is needed. To serially connect a resistor to the ESR, a resistor is serially connected at the output of the voltage regulator 20.

Figure 9:
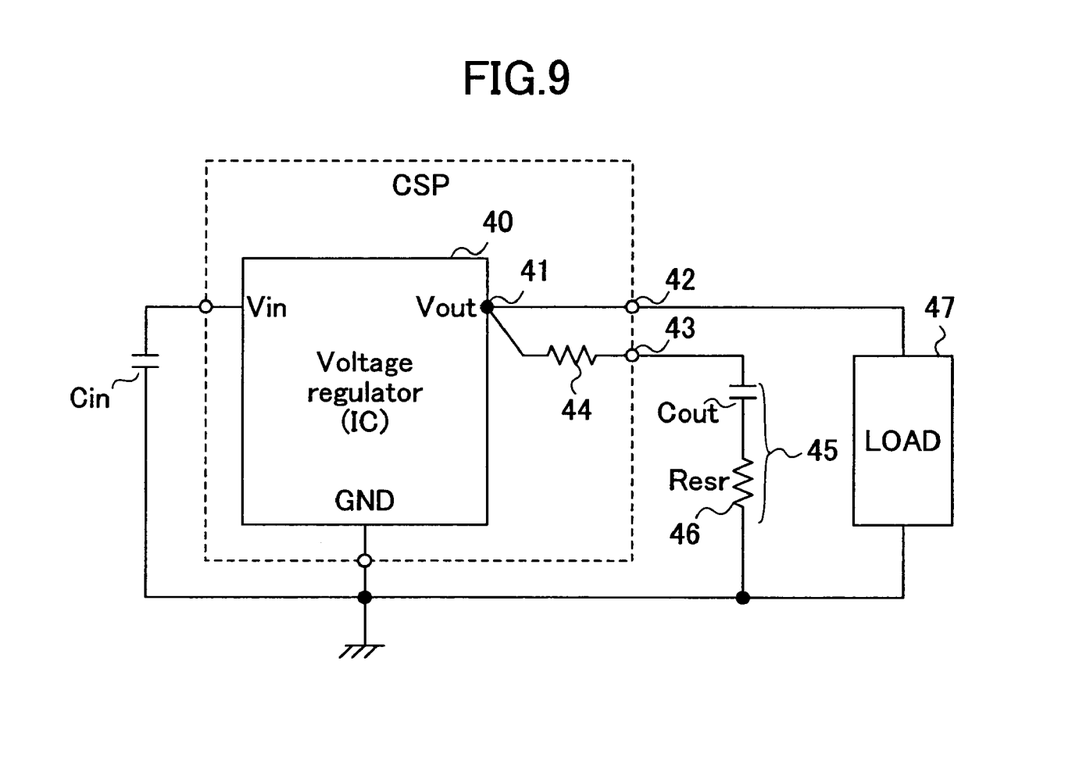
FIG. 9 shows a diagram of the third embodiment (a voltage regulator) of the present invention.

There are two ways to serially connect a resistor at the output of the voltage regulator 20. One way is shown in FIG. 9. In FIG. 9, the bonding pad of the output of the IC is connected to two solder bumps through two reroute traces by means of the present invention as shown in FIG. 4A. This construction can completely prevent a voltage drop at the input of the load, caused by a load current.

As shown in FIG. 9, the bonding pad 41 of the output of the voltage regulator 40 is connected to solder bumps 42 and 43. A load 47 is connected to the solder bump 42 and the capacitor 45 having a capacitance of Cout and a resistance 46 of Resr is connected to the solder bump 43. A reroute trace between the bonding pad 41 and the solder bump 42 is designed to have a resistance of nearly zero. On the other hand, a reroute trace between the bonding pad 41 and the solder bump 43 is designed to form a resistor 44 having a resistance of Rout (several hundred milli-ohms) to serially connect the resistor 44 to the Resr 46. This can be achieved by deliberately lengthening or narrowing the pattern of the copper reroute trace between the bonding pad 41 and the solder bump 43. The construction shown in this embodiment can completely prevent a voltage drop at the input of the load 47, caused by a load current. Therefore, it is possible to serially connect the resistor 44 to the Resr 46 without a voltage drop at the input of the load 47. As a result, it is easy to compensate for the phase of the open loop.

Figure 10:
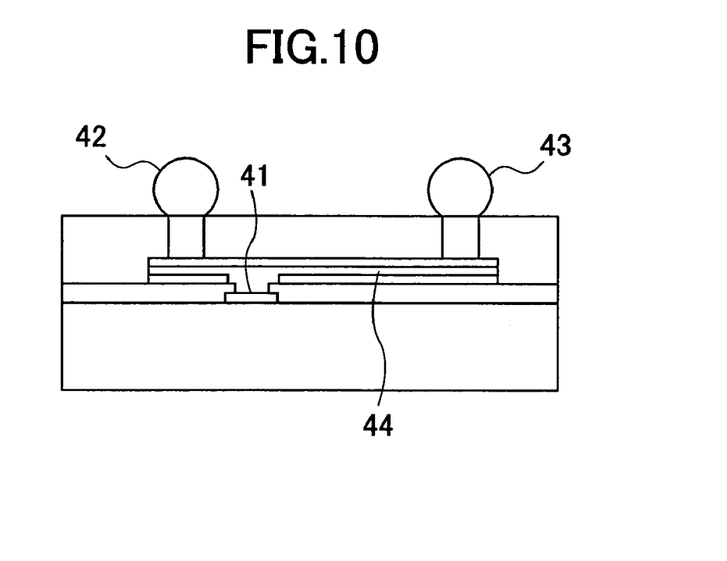
FIG. 10 shows a sectional view of a reroute trace pattern of the voltage regulator shown in FIG. 9.
Figure 11:
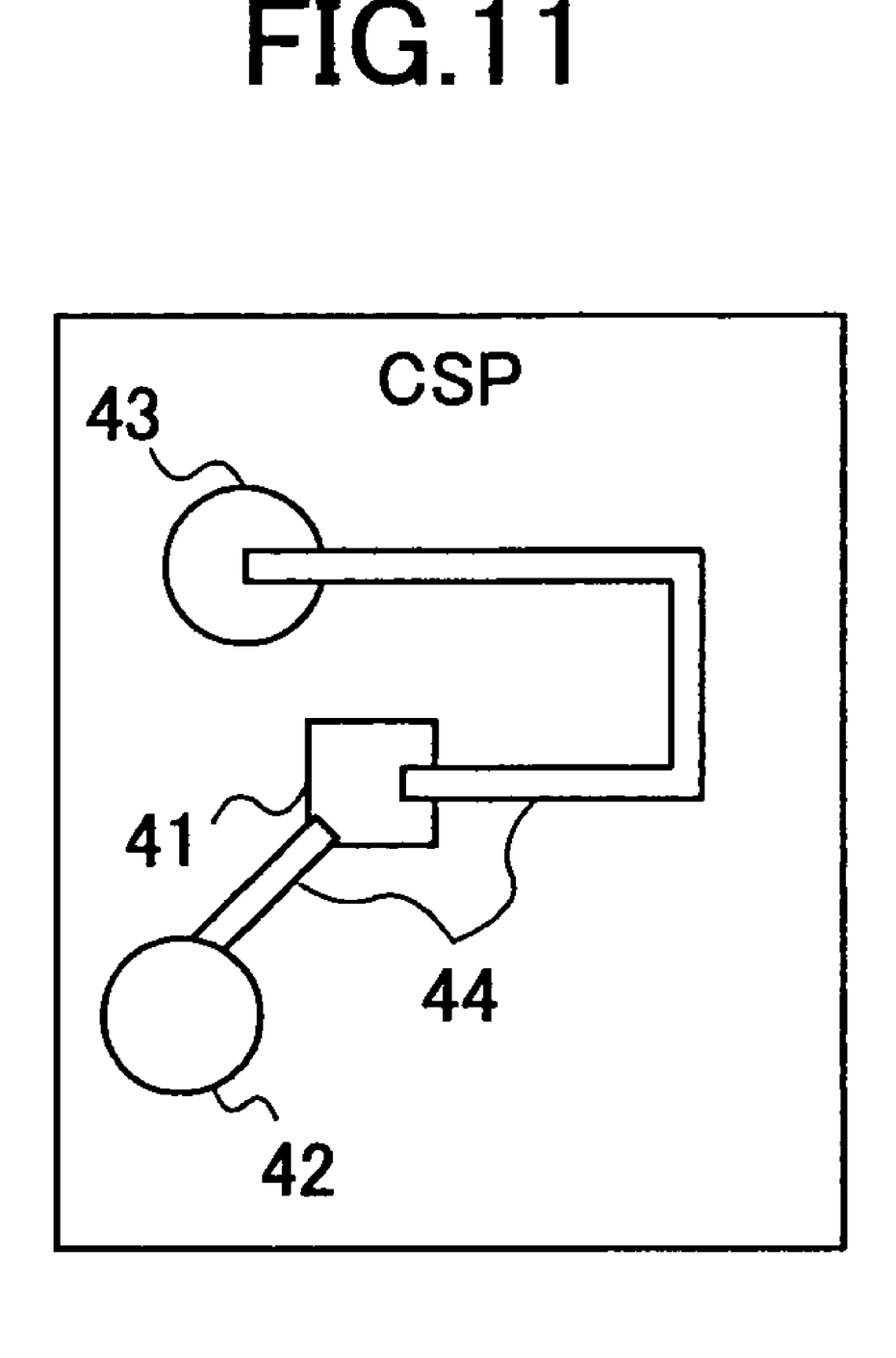
FIG. 11 shows a top view of the reroute trace pattern shown in FIG. 10.

Further, even if the number of terminals are increased, the area size of the CSP remains unchanged because of the CSP. It is also possible to form a plurality of reroute traces and terminals, each of which reroute trace has a different resistance, to be selected for the capacitor to be used, in order to serially connect the resistor to the Resr of the capacitor to optimally match the capacitor to be used. FIG. 10 shows a sectional view, including the reroute trace pattern, of the voltage regulator shown in FIG. 9 and FIG. 11 shows a top view of the reroute trace pattern shown in FIG. 10.

In FIG. 9, the resistance Rout of the resistor 44 is as follows.

Figure 12:
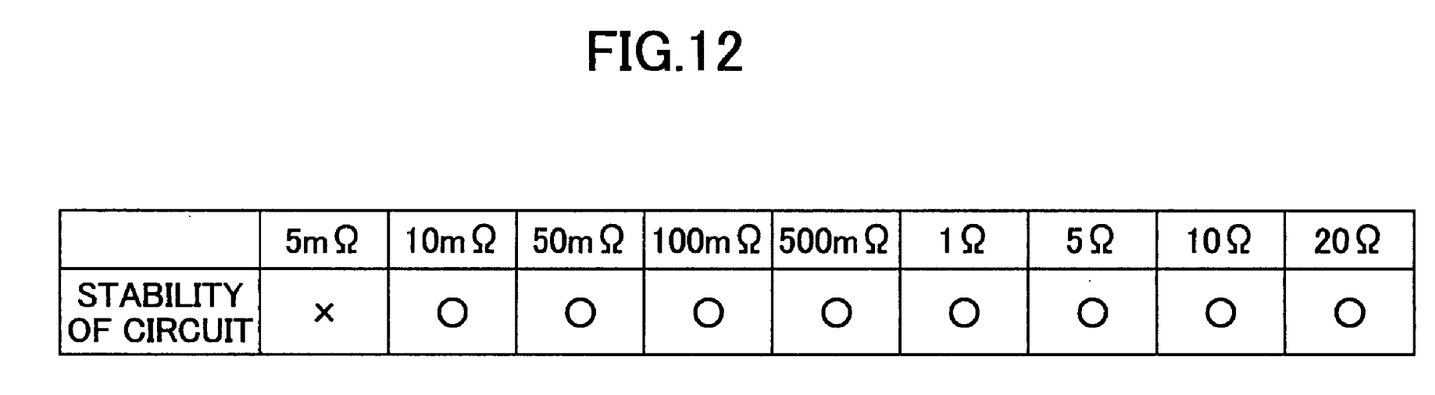
FIG. 12 shows a relationship between the resistance of a resistor Rout and a stability factor of the circuit shown in FIG. 9.

The capacitor 45 commonly used has a capacitance of 0.1 to 10 micro Farads. In the embodiment shown in FIG. 9, the resistance Rout of the resistor 44 can have a large value because the load 47 is connected to the solder bump 42 that is connected to the bonding pad 41 through the reroute trace having the resistance of nearly zero. In FIG. 9, it is suitable for the resistor 44 to have the resistance Rout of between 10 milli-ohms and 10 ohms. FIG. 12 shows a relationship between the resistance Rout of the resistor 44 and a stability factor of the circuit shown in FIG. 9. A mark "X" shows that the circuit oscillates. A mark "O" shows that the circuit does not oscillate. When the resistance Rout of more than 10 ohms is used, it is still possible to prevent the circuit from oscillating. However, it is difficult to form a resistor 44 having such a high resistance using the reroute trace because of the large reroute trace area. Therefore, in this embodiment, it is suitable for the resistor 44 to have the resistance Rout of between 10 milli-ohms and 10 ohms.

In the embodiment, the voltage regulator is placed on the CSP and the phase compensation is performed on the CSP to prevent the voltage regulator from oscillating. However, it is understood that the present invention can be applied to the various kinds of analog circuits.

This can be achieved by deliberately lengthening or narrowing or both lengthening and narrowing the pattern of the copper reroute trace between the bonding pad 41 and the solder bump 43, or this can also be achieved by changing the material to a barrier metal, such as chromium (Cr) or titanium (Ti). As a result, the resistance Rout can be designed to any desired value.

As described above, according to the embodiment, it is possible to determine the circuit characteristics during the CSP manufacturing process. Therefore, the present invention enables providing the circuit design at the wafer level with flexibility. Further, it is easy to improve the circuit characteristics without changing the circuit design at the wafer level.

Further, it is possible to increase the number of terminals of the CSP without increasing the area size of the CSP. Therefore, it is possible to form a plurality of terminals, each of which is for a different use. As a result, this construction can completely prevent the voltage drop at the input of the load, caused by the load current. Further, it is possible to select a capacitor for the phase compensation among various kinds of capacitors because it is possible to form a plurality of terminals connected to different resistors.

FOURTH EMBODIMENT

Figure 13:
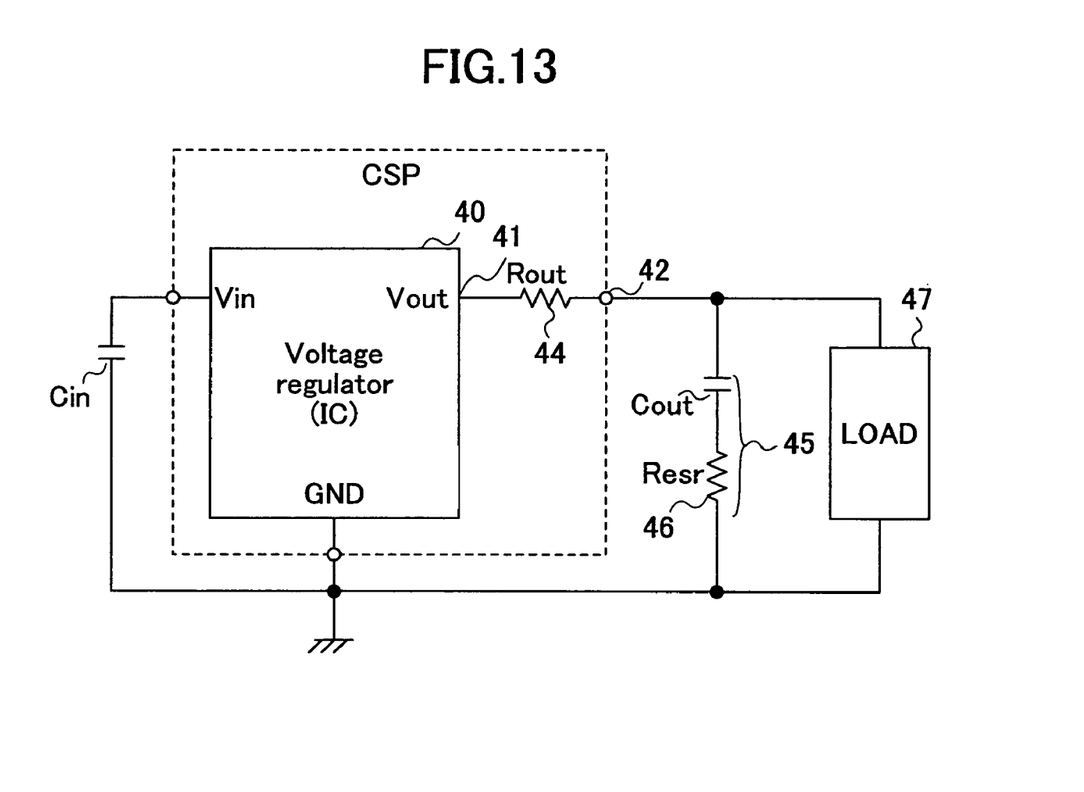
FIG. 13 shows a diagram of the fourth embodiment (a voltage regulator) of the present invention.
Figure 14:
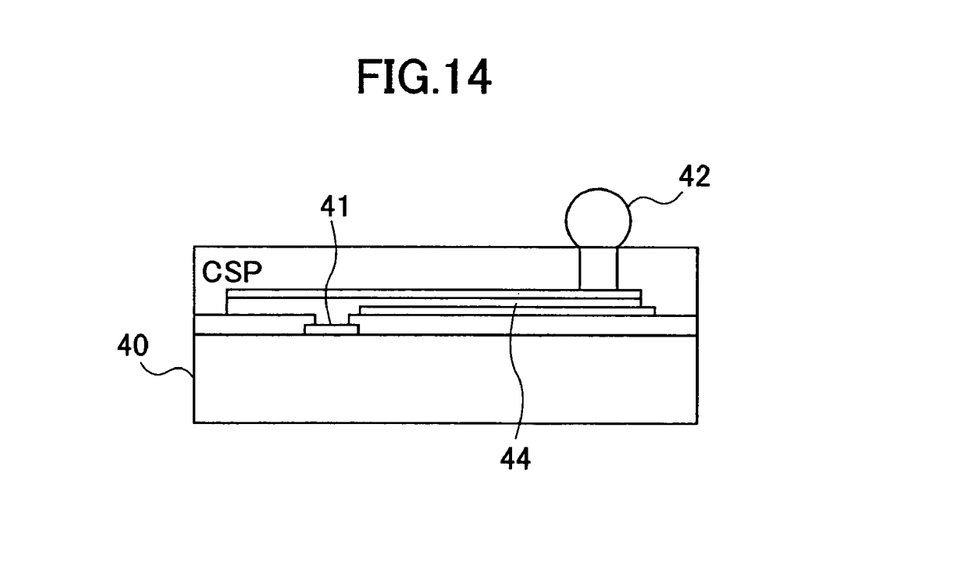
FIG. 14 shows a sectional view of a reroute trace pattern of the voltage regulator shown in FIG. 13.
Figure 15:
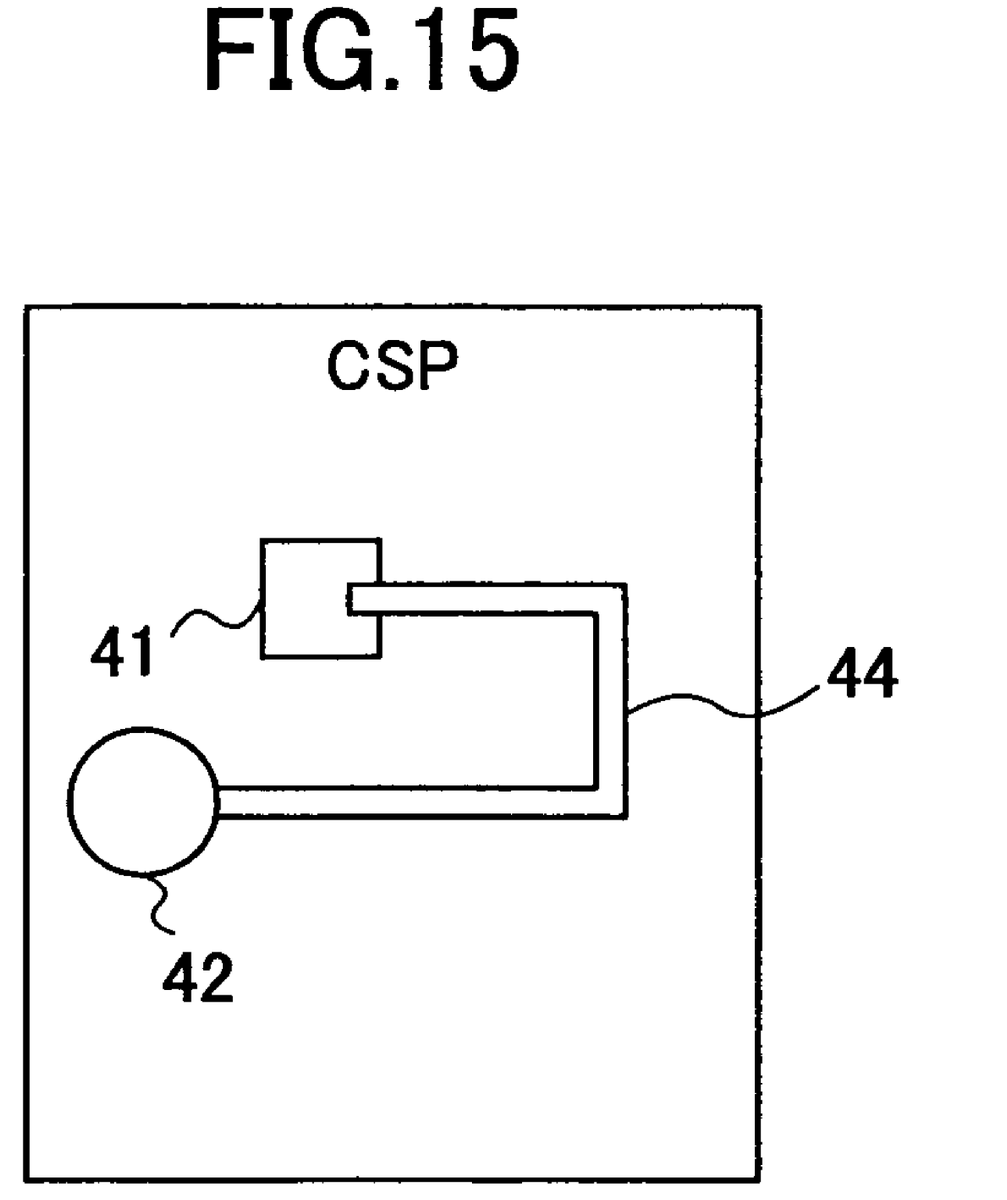
FIG. 15 shows a top view of the reroute trace pattern shown in FIG. 14.

Another way is shown in FIG. 13. FIG. 13 shows a diagram of the fourth embodiment (a voltage regulator) of the present invention. As shown in FIG. 13, the bonding pad 41 of the output of the IC chip 40 is connected to a solder bump 42 through a reroute trace 44 by means of the present invention. A load 47 and a capacitor 45 are connected in parallel to the solder bump 42. The reroute trace 44 has a resistance of Rout. The resistance Rout is designed to have a desired value according to the present invention. This can be achieved by deliberately lengthening or narrowing or both lengthening and narrowing the pattern of the copper reroute trace 44 between the bonding pad 41 and the solder bump 42, or this can also be achieved by changing the material to a barrier metal, such as chromium (Cr) or titanium (Ti). As a result, the resistance Rout is connected in series to the Resr to optimally match the capacitor to be used. FIG. 14 shows a sectional view, including a reroute trace pattern, of the voltage regulator shown in FIG. 13 and FIG. 15 shows a top view of the reroute trace pattern shown in FIG. 14.

In FIG. 13, the resistance Rout of the resistor 44 is as follows.

The capacitor commonly used has a capacitance of 0.1 to 10 micro Farads. However, the resistance Rout of reroute trace 44 is connected between the bonding pad 41 of the IC chip 40 and the solder bump 42 and the load 47 is also connected to the solder bump 42, so that Rout and the load 47 are serially connected. As a result, a drive ability of the voltage regulator becomes low. In FIG. 13, it is therefore suitable for the resistor 44 between the bonding pad 41 and the solder bump 42 to have the resistance Rout of between 10 milli-ohms and 200 milli-ohms.

Figure 16:
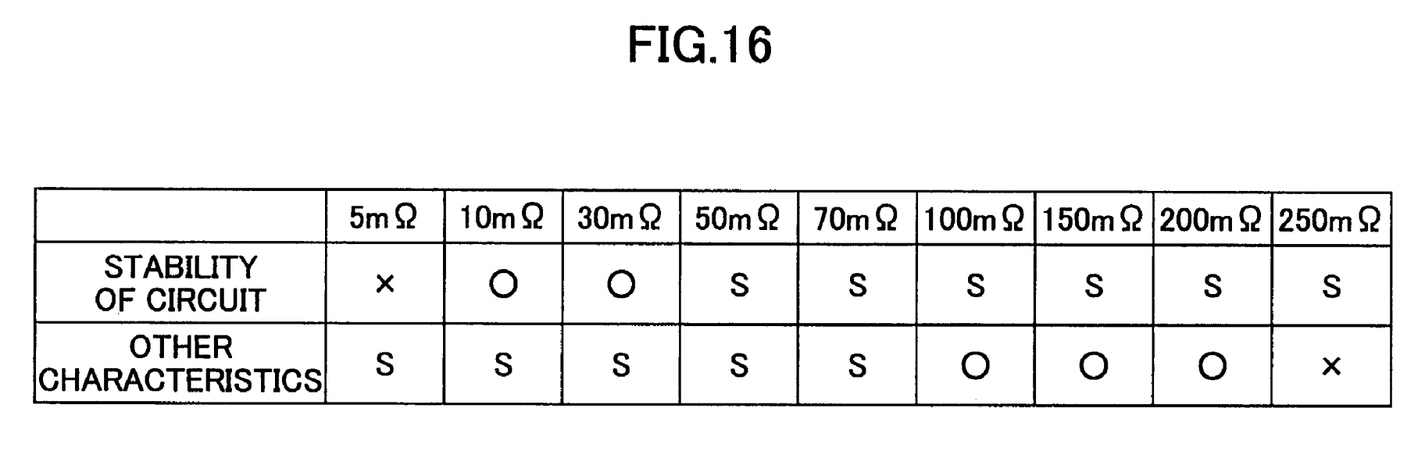
FIG. 16 shows a relationship between the resistance of a resistor Rout and a stability factor of the circuit shown in FIG. 13.

FIG. 16 shows relationships between the resistance of a resistor Rout and a stability factor and other characteristics of the circuit shown in FIG. 13. A mark "X" shows that the circuit oscillates. A mark "O" shows that the circuit does not oscillate. A mark "S" shows a state which is even more stable than the state shown in the mark "O". FIG. 16 shows that the it is suitable for the resistor 44 between the bonding pad 41 and the solder bump 42 to have the resistance Rout of between 10 milli-ohms and 200 milli-ohms. "Other characteristics" in FIG. 16 means a voltage drop that is caused by a load current through the resistance Rout. The higher the resistance Rout becomes, the more the voltage drops.

As described above, according to the embodiment, it is possible to determine the circuit characteristics of the voltage regulator during the CSP manufacturing process. Therefore, the present invention enables providing the circuit design at the wafer level with flexibility. Further, it is easy to improve the circuit characteristics without changing the circuit design at the wafer level.

As described above, according to the embodiment, it is possible to prevent the voltage regulator from oscillating by using the phase compensation capacitor connected to the terminal of the CSP connected to the reroute trace having a resistance between 10 milli-ohms and 200 milli-ohms.

According to the present invention, it is possible to provide a semiconductor device in which specifications and performance of an IC chip can be expanded, and which semiconductor device provides circuit design with flexibility.

Further, according to the present invention, it is possible to provide a semiconductor device including a voltage regulator in which oscillation can easily be suppressed.

Because the circuit constants (for example, a resistance of the reroute trace) determined during the manufacturing process of the CSP are used for the phase compensation, it is possible to improve the characteristics of the voltage regulator without changing the circuit design at the wafer level by means of changing the design of the reroute trace on the CSP. Therefore, the margin for the circuit design at the wafer level is improved. Especially, because of this design margin, it is possible to easily develop the voltage regulator in which a ceramic capacitor is used as the phase compensation capacitor.

The present invention is not limited to the specifically disclosed embodiments, but variations and modifications may be made without departing from the scope of the present invention.

The present application is based on Japanese priority application No. 2001-272091 filed on Sep. 7, 2001 and Japanese priority application No. 2001-272098 filed on Sep. 7, 2001, the entire contents of which are hereby incorporated by reference.

The invention claimed is:

1. A voltage regulator having:
   a voltage regulator circuit contained in a chip size package, said chip size package comprising:
      a semiconductor chip having at least a bonding pad;
      at least a terminal of said chip size package; and
      a reroute trace formed between said bonding pad and said terminal on said chip size package, wherein said reroute trace is formed to have a desired resistance.

2. The voltage regulator as claimed in claim 1, wherein:
said chip size package has a plurality of said terminals, each of which is connected to said bonding pad through one of a plurality of said reroute traces, and
said semiconductor chip comprises a voltage regulator circuit, and a load is connected to one terminal connected to one reroute trace having a lowest resistance among said reroute traces, and a phase compensation capacitor is connected to another terminal connected to another reroute trace having a predetermined resistance among said reroute traces.

3. The semiconductor device as claimed in claim 2, wherein said predetermined resistance is between 10 milli-ohms and 10 ohms.

4. The voltage regulator as claimed in claim 1, wherein:
said semiconductor chip comprises a voltage regulator circuit, and
a load and a phase compensation capacitor are connected to said terminal of said chip size package connected to said reroute trace having said desired resistance.

5. The voltage regulator as claimed in claim 4, wherein said desired resistance of said reroute trace is designed by means of lengthening said reroute trace, narrowing said reroute trace or selecting a material of said reroute trace.

6. The voltage regulator as claimed in claim 4, wherein said desired resistance is between 10 milli-ohms and 200 milli-ohms.

* * * * *

UNITED STATES PATENT AND TRADEMARK OFFICE
CERTIFICATE OF CORRECTION

PATENT NO.       : 7,550,837 B2                                   Page 1 of 1
APPLICATION NO. : 11/331162
DATED            : June 23, 2009
INVENTOR(S)      : Keiichi Kimura et al.

It is certified that error appears in the above-identified patent and that said Letters Patent is hereby corrected as shown below:

Title Page

At line (62), after "7,061,093" add --, which is a continuation of application No. PCT/JP2002/08996, filed on September 4, 2002--.

Signed and Sealed this

Fifth Day of January, 2010

David J. Kappos
*Director of the United States Patent and Trademark Office*